United States Patent [19]

Fish, Jr. et al.

[11] 3,965,423
[45] June 22, 1976

[54] AUTOMATIC FREQUENCY CONTROL SYSTEM

[75] Inventors: Lawrence W. Fish, Jr.; Ronald C. Evans; Sidney A. Corderman, all of Binghamton, N.Y.

[73] Assignee: McIntosh Laboratory Inc., Binghamton, N.Y.

[22] Filed: July 17, 1974

[21] Appl. No.: 489,123

[52] U.S. Cl............................. 325/346; 307/235 A; 325/420
[51] Int. Cl.².......................................... H04B 1/28
[58] Field of Search ........... 325/420, 423, 418, 346; 307/235 A, 236, 262

[56] References Cited
UNITED STATES PATENTS

| | | | |
|---|---|---|---|
| 2,691,097 | 10/1954 | Atwood | 325/420 |
| 3,609,554 | 9/1971 | Stoker | 325/346 |
| 3,764,917 | 10/1973 | Rhee | 325/420 |
| 3,869,674 | 3/1975 | Borbely | 325/346 |

Primary Examiner—George H. Libman
Attorney, Agent, or Firm—Elliott I. Pollock

[57] ABSTRACT

A superheterodyne f.m. receiver having a manually tunable local oscillator which is electronically voltage tunable over a small range, and including a frequency discriminator for providing signal voltage and a.f.c. voltage in response to a received f.m. carrier, wherein is provided an electronic bipolar switch responsive to either positive or negative a.f.c. voltage of greater than a predetermined value for effecting grounding of a point of an a.f.c. circuit which applies a.f.c. voltage to the local oscillator, and which also includes an interchannel noise detector which also provides grounding signal for that same point of the a.f.c. circuit.

6 Claims, 1 Drawing Figure

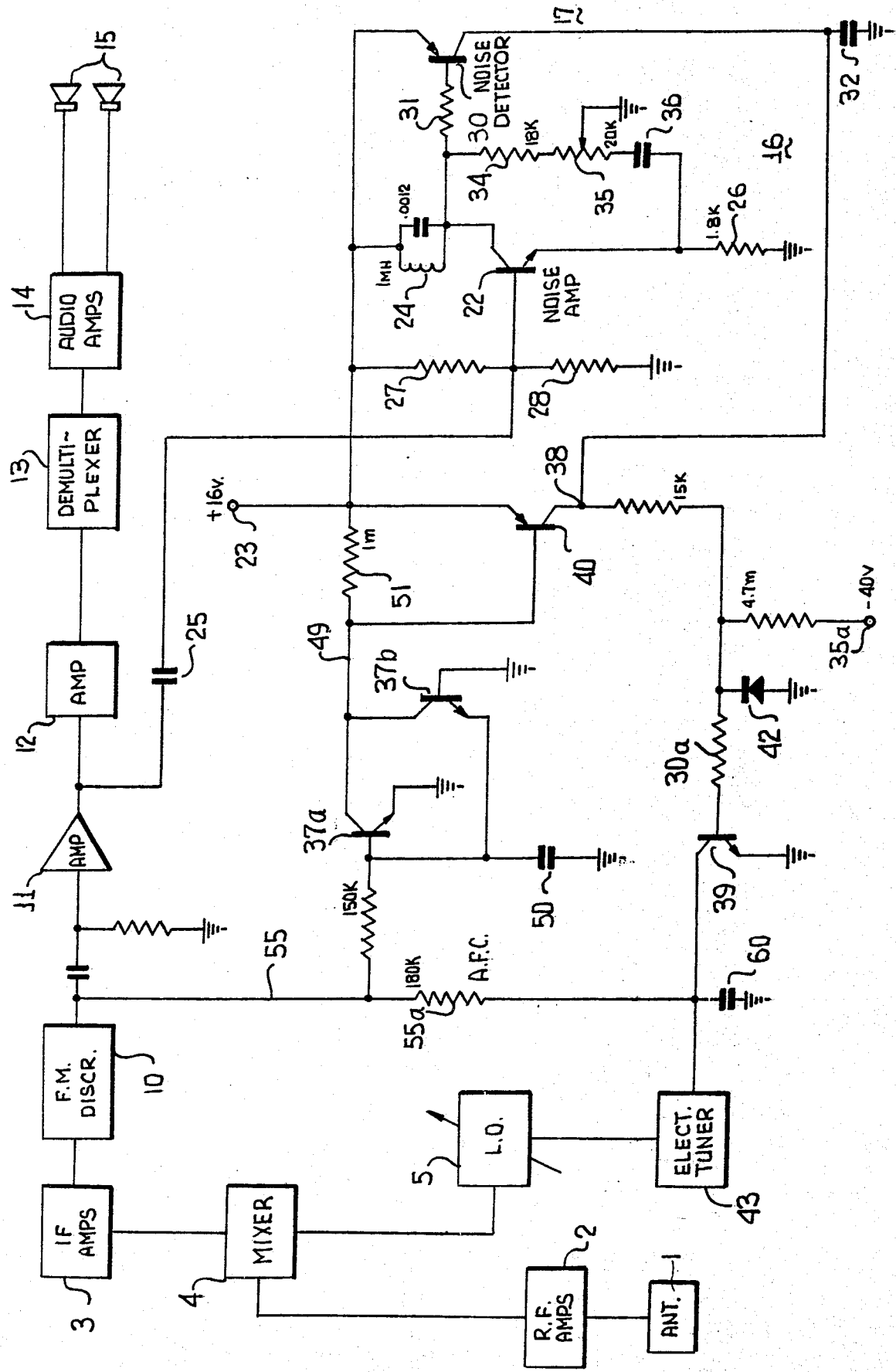

AUTOMATIC FREQUENCY CONTROL SYSTEM

BACKGROUND OF THE INVENTION

In commercial superheterodyne receivers, the local oscillator, after having been manually tuned to a frequency which converts a received signal to a predetermined i.f. frequency, is maintained tuned by means of an a.f.c. circuit. The latter derives an a.f.c. voltage at the frequency discriminator of the receiver, and applies that voltage to an electronic tuner, such as a voltage sensitive capacitor, connected in tuning relation to the local oscillator of the receiver. The problem is then faced that, after the a.f.c. circuit has locked the receiver to a carrier signal, it tends to hold the tuning when the local oscillator frequency is manually detuned, in opposition to the manually detuning, and thereby renders tuning to an adjacent carrier difficult. It is an object of the present invention to provide a control circuit for disabling the a.f.c. circuit of a superheterodyne receiver whenever the a.f.c. voltage of the receiver exceeds a predetermined level, indicative of manual detuning, and to employ parts of that control circuit for disabling the a.f.c. circuit in response to inter-channel noise. Thereby, a relatively slight movement of the tuning dial effects disablement of the a.f.c. circuit, and that disablement continues between channels. The a.f.c. circuit becomes again effective only when manual tuning has provided nearly precise capture of a second carrier signal.

SUMMARY OF THE INVENTION

The d.c. output of an a.f.c. circuit of an f.m. receiver is applied to a gate which generates a control voltage for turning on a transistor control switch when the a.f.c. voltage exceeds a predetermined value of either polarity. The control switch applies voltage to turn on an a.f.c. circuit grounding switch, which is also turned on in response to detected interchannel noise.

DESCRIPTION OF THE DRAWING

The single FIGURE of the drawing is a schematic circuit diagram of a system according to the invention.

DETAILED DISCLOSURE

An f.m. carrier, conventionally modulated according to FCC specifications, is received by an antenna 1, amplified in r.f. amplifiers 2, and converted to i.f. frequency for i.f. amplifiers 3 by mixer 4. The latter is supplied with local oscillator frequency from manually tunable local oscillator 5, which is also electronically tunable in response to an a.f.c. voltage in conventional fashion. The output of the i.f. amplifiers 3 is supplied to an f.m. discriminator 10.

A signal containing stereo information is derived in the usual fashion from f.m. discriminator 10. This signal is supplied to amplifier 11 and to further amplifier 12, which supplies detected signal to a conventional de-multiplexer 13. Stereo signals are derived therefrom and amplified in two stereo amplifiers 14, and acoustically radiated, in conventional fashion, by loudspeakers 15.

The output of the amplifier 11 is supplied to a noise amplifier 16 comprising transistor 22, which is an NPN transistor having its collector connected to a source of positive dc voltage 23 via a band pass filter circuit 24, tuned to 100. KHz., its base coupled via capacitor 25 to the output of amplifier 11, and its emitter connected to ground via resistance 26. Transistor 22 is normally biased on via a voltage divider consisting of series resistances 27, 28 connected between d.c. source 23 and ground, and amplifier 16 serves selectively to amplify noise signal at 100. KHz.

Noise signal amplified by amplifier 16 is detected by detector 17 comprising transistor 30. The latter is a PNP transistor having its emitter directly connected to positive terminal 23, its base connected via resistance 31 to the collector of transistor 22, and its collector connected to the integrating capacitor 32 and also is supplied with negative dc voltage from negative voltage source 35a, of −40.V.

The collector of noise amplifying transistor 22 is connected to ground through a fixed resistance 34, in series with an adjustable resistance 35 and with a capacitor 36. By adjusting the value of resistance 35, the amplitude of noise signal applied to noise detector 30 can be adjusted, but elements 34, 35, 36 do not affect bias of transistor 30.

Transistor 30 is normally off, but conducts when supplied with noise signal by transistor 22, raising the voltage across capacitor 32 and therefore of point 38 well above ground, and rendering NPN transistor 39 conductive. The transistor 39 has a grounded emitter, and a base connected via resistance 30a to point 38. That point is connected to highly negative source 35a, but diode 42 clamps the voltage applied to the base of transistor 39 to a small negative value. When point 38 goes positive, in response to output from transistor 30, transistor 39 becomes conductive and shunts the a.f.c. diode of electronic tuner 43 to ground disabling the a.f.c. circuit of the receiver, and leaving the receiver free for manual control.

If the direct output of the a.f.c. circuit on lead 55 exceeds ±.5V, either NPN transistor 37a or NPN transistor 37b will conduct, depending on polarity of the a.f.c. signal, causing PNP transistor 40 to become conductive and raising the voltage of point 38 above ground, which turns transistor 39 on, and shorts electronic tuner 43 to ground, disabling electronic tuner 43.

If transistor 37a conducts, in response to positive voltage on lead 55, there exists a direct path to ground from dc source 23, via resistance 51 (1 M.) and transistor 37a. This applies ground potential at the base of PNP transistor 40, which turns it on. If transistor 37b conducts, in response to negative voltage at its emitter, that transistor applies voltage across capacitor 50, which tends to turn transistor 37a on. In either case a grounding circuit exists for transistor 40, which turns on, raising the voltage of point 38, turning on transistor 39 and disabling the a.f.c. circuit.

In operation, assuming that the receiver is tuned to a carrier, a.f.c. voltage on lead 55 is zero. If there exists local oscillator drift, a.f.c. voltage will be developed by f.m. discriminator 10, which will be of such sense and magnitude as to maintain the tuning of the receiver to that carrier, but which will be inadequate in amplitude to turn on either of transistors 37a, 37b. Upon attempting to manually tune the receiver to a new carrier, the a.f.c. circuit develops an error signal which tends to defeat the manual tuning operation.

In accordance with the present invention, when the a.f.c. voltage attains about +.5V transistor 37a turns on, and when the a.f.c. voltage attains about −.5V transistor 37b turns on. In either case, point 49 drops in value, since current then flows from supply terminal 23 through large resistance 51. Transistor 40 then turns on, raising the voltage at point 38 to a positive value, turning on transistor 39, which grounds the electronic tuner 43, disabling the a.f.c. circuit. The receiver is then freely manually tunable. The a.f.c. circuit remains disabled until a new carrier is sufficiently closely tuned so as to provide less than ±.5V of a.f.c. voltage, whereupon the a.f.c. circuit becomes operative.

The a.f.c. defeat system as described is not in itself adequate, because when the receiver is tuned between channels there exists zero a.f.c. voltage, on average. While tuned between channels, high frequency interchannel noise, at about 100. KHz., appears at the output of f.m. discriminator 10. According to the invention, this noise is filtered out by filter 24 and detected by noise detector 30. The latter provides a positive detected voltage, in that noise randomly turns on the transistor 30. Supply voltage from terminal 23 is integrated in capacitor 32 and applied to point 38, turning on transistor 39, and disabling the electronic tuner 43.

Output from discriminator 10 is sufficiently isolated from transistor 39 by resistance 55a that the output of the discriminator 10 is approximately the same, whether or not transistor 39 is on. Random noise, apart from interchannel noise, will not charge capacitor 32 sufficiently to cause a.f.c. defeat. An integrating capacitor 60 is connected from the collector of transistor 39 to ground, so that the d.c. output of the detector and not the received signal is applied to tuner 43.

What we claim is:

1. In a frequency modulation receiver having a local oscillator for varying the intermediate frequency output of a mixer, a frequency discriminator responsive to said intermediate frequency output to provide signal frequency and a.f.c. voltage, means responsive to said signal frequency for producing sterophonic signals in separate audio channels, electronic tuning means connected to said local oscillator and responsive to said a.f.c. voltage to tend to reduce said a.f.c. voltage to zero, a bipolar voltage sensing circuit responsive to said a.f.c. circuit to provide a control voltage only when a.f.c. voltage exceeds predetermined positive or negative values, and means responsive to said control voltage for grounding said electronic tuning means, said bipolar voltage sensing circuit including a source of dc supply voltage, a first NPN transistor, a second NPN transistor, a PNP transistor, said PNP transistor including a base, an emitter connected to said source of dc supply voltage, a resistance connected between said source of dc supply voltage and said base, said first and second NPN transistors each including a collector connected to said base, means responsive to turning on of said PNP transistor for providing said control voltage, said first NPN transistor including a base connected to said frequency discriminator and a grounded emitter, said second NPN transistor including an emitter connected to said frequency discriminator and a grounded base, means for detecting interchannel noise produced by said frequency discriminator and producing a further control voltage in response to said interchannel noise, and means responsive to said further control signal for grounding said electronic tuning means.

2. The combination according to claim 1, including a capacitor coupling said base of said first NPN transistor and said emitter of said second NPN transistor to ground.

3. In a superheterodyne receiver, a local oscillator for establishing the tuned frequency of said receiver, a circuit responsive to detuning of said local oscillator for developing a bipolar a.f.c. voltage having an amplitude which is a function of the extent of said detuning, a first NPN transistor having a first base, first emitter and first collector, a second NPN transistor having a second base, second emitter and second collector, means connecting said first base and said second emitter to a point of said a.f.c. circuit, means grounding said first emitter and said second base, means applying dc supply voltage to said first and second collectors, means responsive to turning on of either of said transistors for grounding a second point of said a.f.c. circuit, and means substantially isolating said first point from said second point in respect to voltage variations.

4. The combination according to claim 3, wherein said means substantially isolating is a resistance.

5. The combination according to claim 3, wherein is provided a capacitor providing a connection between said first base and said second emitter and ground, and a current reducing resistance connected between said first point and said first base and second emitter.

6. The combination according to claim 5, wherein said means applying dc supply voltage to said first and second transistors includes, a voltage supply terminal, a third PNP transistor having a third base, emitter and collector, a source of negative dc voltage, means connecting said third collector to said source of negative voltage, means connecting said third emitter to said voltage supply terminal, resistance connected between said third emitter and said third base, means connecting said third base to said first and second collectors, and means responsive to turn on of said third transistor for grounding said second point.

* * * * *